May 12, 1970 W. ELLERMEYER 3,512,101
HIGH IMPEDANCE INPUT CIRCUIT FOR OPERATIONAL AMPLIFIER CIRCUITS
Filed March 22, 1968
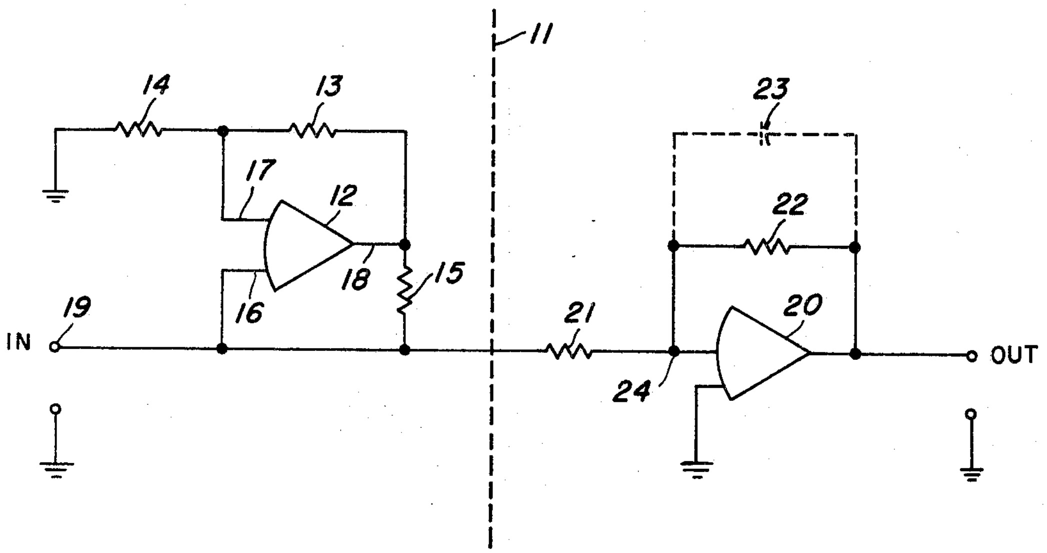
INVENTOR
WALTER ELLERMEYER
BY J. Peter Mohn
ATTORNEYS

United States Patent Office 3,512,101

Patented May 12, 1970

3,512,101

HIGH IMPEDANCE INPUT CIRCUIT FOR OPERATIONAL AMPLIFIER CIRCUITS

Walter Ellermeyer, 4878 Niagara Ave., Apt. 10, San Diego, Calif. 92107

Filed Mar. 22, 1968, Ser. No. 715,337
Int. Cl. H03f *1/36*
U.S. Cl. 330—69 2 Claims

ABSTRACT OF THE DISCLOSURE

A high-input-impedance driver circuit for an inverting-type operational amplifier stage is disclosed. The driver includes a differential input operational amplifier arranged to operate as a conventional non-inverting stage. By adding another feedback resistance path to the conventional non-inverting configuration, the resultant circuit can drive a second operational amplifier stage with unique results. When the ratio of the added resistance to the input resistance of the second stage is made equal to a predetermined value, the first stage becomes a very-high-input-impedance device. Thus the input voltage to the inverting amplifier stage is always proportional or equal to the amplitude of the input voltage of the driver stage.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to high-input-impedance circuits and more particularly to very high-input-impedance circuits for driving operational amplifiers or other devices having very low input potentials.

The so-called operational amplifier is an electronic device which has received substantial acceptance in recent years by the electronics industry. As is well known, the device comprises a very high gain DC amplifier with substantial negative feedback. The chief utility of the device resides in the fact that it has a precise gain characteristic dependent only on the feedback used.

Operational amplifiers find numerous applications in the analog computer field and in electronic instrumentation in general. Their use in measuring devices is considerable. It is this latter application that the instant invention is particularly directed to.

Whenever one electronic circuit is used to measure a parameter, such as voltage, in another electronic circuit, it is imperative that the circuit being measured is not effected by the connection of the measuring circuit. This consideration dictates that the measuring circuit have a very high input impedance. Various circuits have been developed in the prior art to provide the needed high input impedance. One such circuit is commonly referred to as a "bootstrap circuit" and comprises a pair of operational amplifiers with feedback between the output of the second amplifier and the input of the first of the pair. The output of the overall circuit is taken from the output terminal of the first operational amplifier. The second operational amplifier in such circuits operates as a source of current for the input of the first stage. By elementary electrical theory it can be shown that the semaller the current drain by a particular device in relation to its input voltage, the higher its input impedance is. The conventional bootstrapping arrangement operates very effectively, however it can be noted that it requires two operational amplifiers. It is desirable to achieve the same function that the bootstrapping circuit achieves but with a reduction in number of components and obvious attendant reduction in cost and physical dimensions.

An object of the present invention is to provide a very high-input-impedance device which uses a minimum number of components. A further object of this invention is to provide a very high-input-impedance operational amplifier driver circuit which utilizes a single operational amplifier stage.

SUMMARY OF THE INVENTION

The instant invention achieves the above noted objects by a circuit comprising a non-inverting operational amplifier stage having a gain of A and being provided with a feedback resistance between its input and output. The input of an inverting operational amplifier stage to be driven is then connected to the input of said non-inverting stage. When the ratio of the feedback resistance to the input resistance of the second stage is made equal to the gain A of the first stage minus one ($A-1$) the input of the first stage presents a very high impedance to any signals at such point. Thus the input voltage to the inverting amplifier will always be proportional or equal to the input voltage of the non-inverting amplifier. The manner in which the invention operates will be better understood from the ensuing detailed description in conjunction with the attached drawing wherein the figure is a schematic diagram of one embodiment of the present invention.

DESCRIPTION OF THE PREFERRED EMBODIMENT

Before considering in detail the structure and operation of one preferred embodiment of the instant invention, a few preliminary points should be considered. Firstly, throughout the specification the term "operational amplifier" has been and will be used without discussion of details of construction and operation of said class of devices. Similarly, in the figure, the high-gain DC amplifier portion of the operational amplifier has been represented by its conventional symbol and no showing of the actual circuitry is made. Numerous publications are available in the art which describe such details. One such publication is the "Handbook Of Operational Amplifier Applications" published by the Burr-Brown Research Corporation, first edition (1963).

Secondly, the instant invention is described as a high-input-impedance device for driving an operational amplifier. It should be understood that the stage to be driven need not be an operational amplifier but may instead be any type of electrical device whose input terminal is essentially at ground potential. With these considerations in mind reference should now be made to the figure.

In the figure, the actual elements of the instant invention are shown to the left of the dotted line 11 and comprise a high gain DC amplifier 12 and resistances 13, 14, and 15. Amplifier 12 has a first input 16, a second input 17, and an output 18 and is commonly referred to as having a differential input. Resistances 13 and 14 are serially arranged between output 18 and ground potential and function as a voltage divider. Input 17 is connected to the common point between resistances 13 and 14 and therefore receives some fraction of the voltage which might be present at output 18. The ratio of the resistances 13 and 14 determines the gain A of the amplifier and in particular:

$$A=\frac{R_1+R_2}{R_2}$$

Resistance 15 provides feedback between output 18 and the first input 16. An input terminal 19 is also connected to input 16 of amplifier 12 and comprises the input of the instant invention. In the absence of feedback resistance 15, the circuit may be recognized as a conventional non-inverting operational amplifier. It is the addition of feedback resistance 15 to the conventional circuit wherein the uniqueness of the instant invention resides.

The value of resistance 15 is quite critical in relation to other parameters in the circuit, including the parameters of the stage to be driven. In the figure, the circuitry shown to the right of dotted line 11 comprises the stage to be driven. It may be recognized as a conventional inverting-type of operational amplifier stage. The inverting stage comprises a high-gain DC amplifier 20, input resistance 21, and feedback resistance 22. As is well known in the operational amplifier art, the gain of the inverting-type stage equals the ratio of the feedback resistance to the input resistance.

It should be re-emphasized at this point that the instant invention may be used to drive circuits other than those which appear exactly as shown in the figure. As indicated by the dotted lines, a capacitor 23 could be added in shunt with feedback resistance 22 to make the overall stage function as that of a filtering amplifier. The one characteristic of the driven stage which must be present for the driving stage to achieve its intended purpose is that the input point of the amplifier must be substantially at ground level. In the case of inverting operational amplifiers, by definition such condition always exists. In the figure, this would means that point 24, the input of the high gain amplifier 20, is substantially at ground potential. Obviously it is not exactly at ground potential but is close enough for such an assumption to be made for circuit calculations.

For the instant invention to achieve its very high-input resistance, or impedance, the following condition must exist: the ratio of the feedback resistance 15 to the input resistance 21 of the driven stage must be substantially equal to the gain A of the driving stage minus 1. Such a relationship is the ideal one but is substantially correct if it is presumed that point 24 is substantially at ground potential. With the noted condition in mind, the operation of the circuit can be examined to show the theory of operation.

For purposes of explanation assume that the gain A of the first or driving stage equals two and the input resistance 21 of the driven stage equals 10K ohms. By the above noted conditions for determining the value of the feedback resistance 15 it can readily be determined that it too must equal 10K ohms. Now assuming that a signal having a magnitude of 10 volts is applied to input 19, the manner in which the instant invention achieves its high input impedance can readily be noted. With a signal of 10 volts at point 19 and hence at terminal 16 of amplifier 12, since the gain A has been stated as equal to two, a signal of twenty volts would be present at output 18. A difference of potential therefore exists across feedback resistance 15, of twenty volts minus ten volts or ten volts. It is obvious, therefore, that a current of essentially one milliampere would flow through resistance 15. Similarly, the voltage across resistance 21 would be ten volts, i.e., the difference in potential between point 19 and point 24. Since resistance 21 also has a value of 10K ohms the current through it would also be one milliampere. Since one milliampere flows through resistance 21 and one milliampere flows through resistance 15, it should be apparent that substantially zero current comes from input 19, since amplifier 12 supplies substantially all the current needed by the driven stage. Since input impedance equals the input voltage divided by the input current, as the input current is made substantially equal to zero, the input impedance necessarily approaches an infinite value. Such is the case in the circuit of the instant invention and it should therefore be readily apparent that in accordance with this invention a very high-input-impedance device can be constructed utilizing a minimum of components. This invention achieves in one additional stage to an existing circuit what the prior art requires numerous stages to achieve. The possible cost and space saving considerations are obvious.

Although this invention has been shown and described with relation to a particular embodiment thereof it should be understood that it is not intended to be limited thereto for various changes and modifications could be made by one having ordinary skill in the art without departing from the spirit and scope of the invention.

What is claimed is:

1. A high input impedance driver circuit for driving an electrical device having an input terminal at ground potential comprising:

a non-inverting operational amplifier having a first and a second input and an output, a voltage dividing network comprising a first resistance $R_1$ connected between the output of said operational amplifier and said first input and a second resistance $R_2$ connected between said first input and a reference potential, said resistors being connected in series, the gain "A" of said operational amplifier being equal to $$\frac{R_1+R_2}{R_2}$$

a feed back resistance connected between said second input and the output of said operational amplifier, said electrical device to be driven having a series input resistance, the input terminal of said electrical device being connected to said second input of said operational amplifier, said second input being adapted to receive an input voltage signal to be applied to said electrical device, the ratio of said feedback resistance to said input resistance being equal to $(A-1)$.

2. The circuit of claim 1 wherein said electrical device comprises an inverting operational amplifier.

References Cited

Butler, "Impedance Convertors Using Wide-Band Feedback Amplifiers," Electronic Engineering, October 1966, pp. 639–641.

Handbook of Operational Amplifier Applications, Burr-Brown Research Corporation, First Edition (1963), p. 7.

ROY LAKE, Primary Examiner

J. B. MULLINS, Assistant Examiner

U.S. Cl. X.R.

330—108